United States Patent [19]

Rennard

[11] Patent Number: 4,797,642

[45] Date of Patent: Jan. 10, 1989

[54] ZERO-SETBACK SLIDING LOAD FOR NETWORK ANALYZER CALIBRATION

[75] Inventor: Robert E. Rennard, Evanston, Ill.

[73] Assignee: Hewlett-Packard Company, Palo Alto, Calif.

[21] Appl. No.: 140,177

[22] Filed: Dec. 31, 1987

[51] Int. Cl.⁴ .......................... H01P 1/26; H01P 1/00
[52] U.S. Cl. ................................ 333/22 R; 74/100 R; 74/105; 74/106; 333/260; 439/578
[58] Field of Search ...................... 333/22 R, 245, 260; 439/310, 331, 341, 578, 581, 583, 675; 74/97, 100 R, 105, 106, 520; 200/16 B, 16 E, 61.5, 163, 318

[56] References Cited

U.S. PATENT DOCUMENTS

| | | | |
|---|---|---|---|
| 1,370,189 | 3/1921 | Cohen | 200/163 |
| 1,933,506 | 10/1933 | Noyes | 200/163 |
| 1,952,153 | 3/1934 | Young | 200/163 |
| 2,563,335 | 8/1951 | Istrati et al. | 200/163 X |
| 2,828,469 | 3/1958 | Martinelli et al. | 333/22 R |
| 3,001,417 | 9/1961 | Becker et al. | 200/318 X |
| 3,187,120 | 6/1965 | Akst | 200/16 E |
| 3,200,597 | 8/1965 | Stotz | 74/106 X |
| 3,254,316 | 5/1966 | McHenry | 333/22 R |
| 3,625,088 | 12/1971 | Sundermann | 74/520 |

Primary Examiner—Paul Gensler
Attorney, Agent, or Firm—Bradley A. Perkins; Edward Y. Wong; William H. F. Howard

[57] ABSTRACT

A sliding load for calibrating a microwave network analyzer provides an alignment of its center conductor relative to a reference plane defined by its outer conductor. The sliding load includes a latching assembly which in an unlatched condition allows the center conductor to move freely in an axial direction relative to the outer conductor. The center conductor can then project forward of the outer conductor for visual alignment with a mating center conductor of a network analyzer connector. Once the center conductors are mated, the outer conductor of the sliding load and the connector can be butted at the reference plane. The latching assembly can then be rotated into its latched condition in which a spring is compressed. The compressed spring forces the center conductor to retract against a screw stop. The screw stop is adjusted so that when the center conductor is forced against it, the desired alignment of the center conductor and the reference plate is achieved. As a result of this alignment, the sliding load does not obscure or exaggerate the contribution of network analyzer connector setback to changes in signals transmitted by the network analyzer. Thus, the network analyzer can be more accurately characterized and calibrated so that it, in turn, can characterize devices under test more precisely.

11 Claims, 4 Drawing Sheets

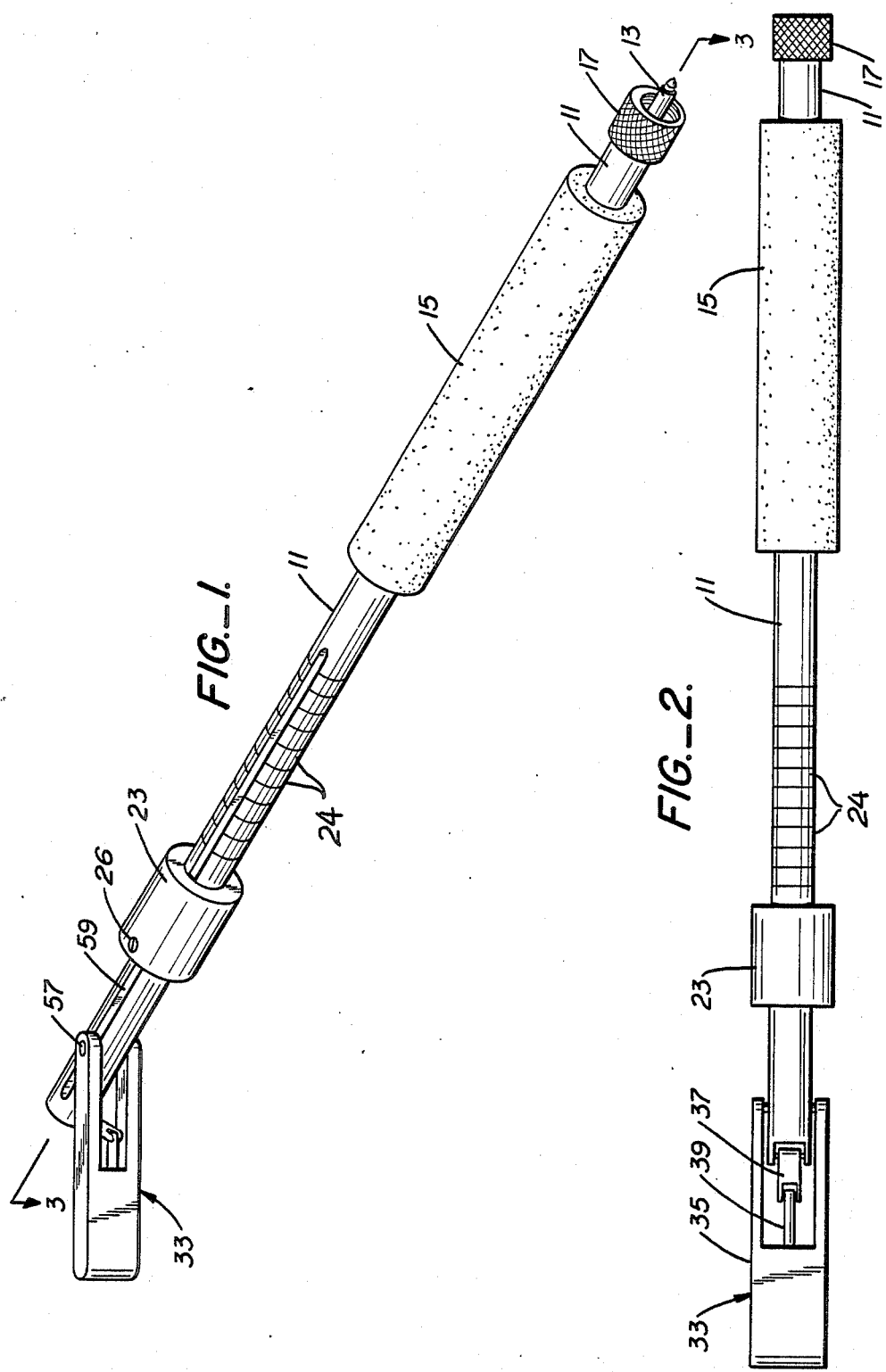

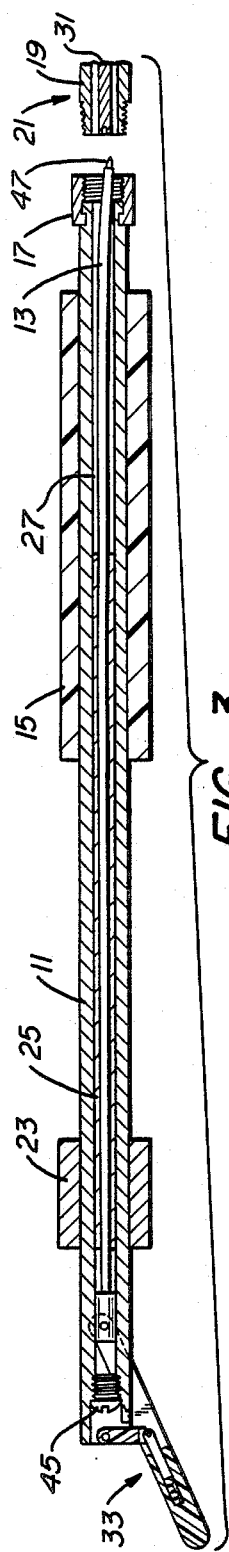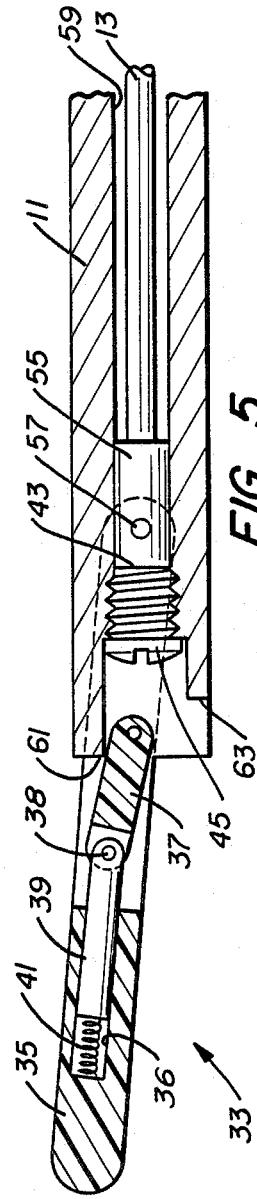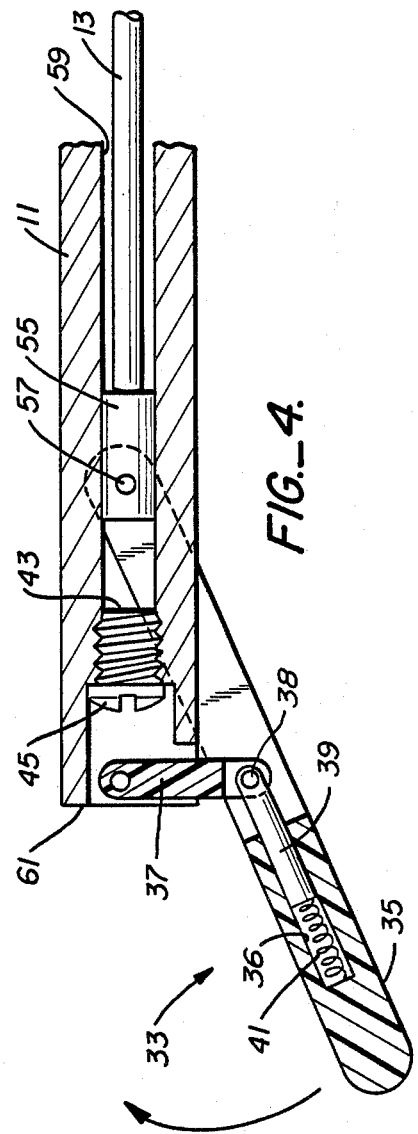

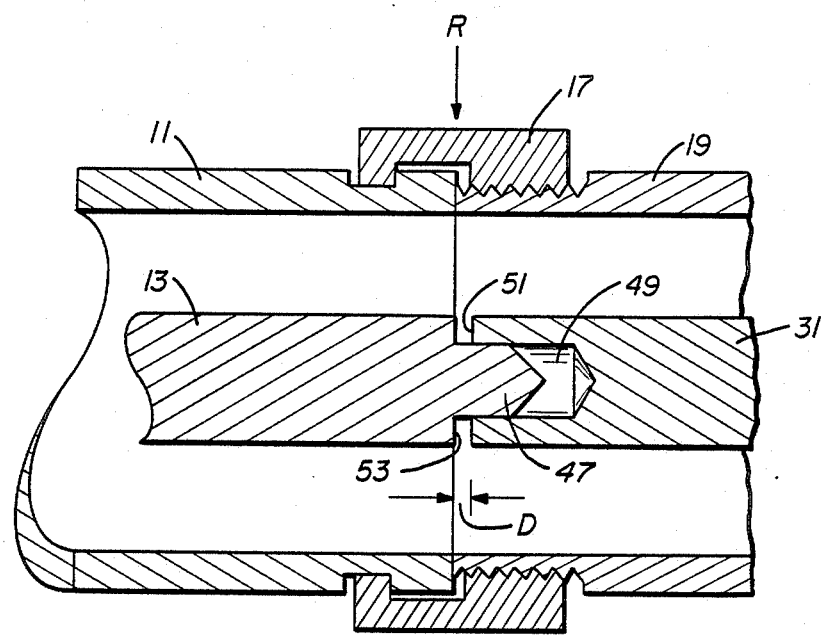
FIG._6.
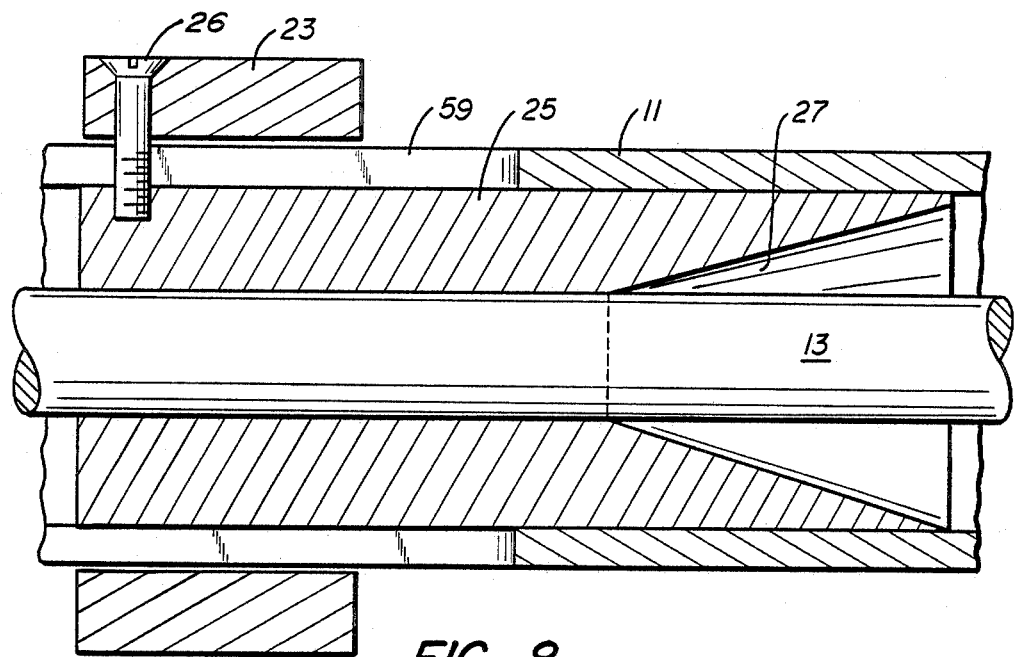
FIG._8.

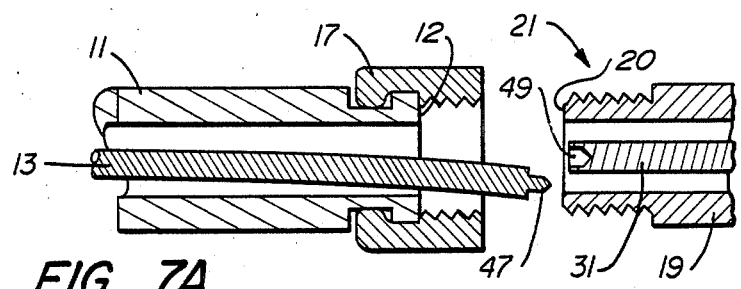
FIG._7A.
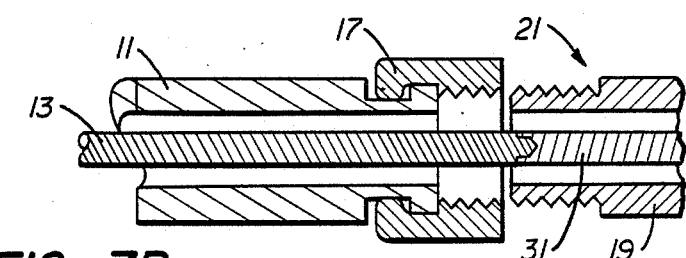
FIG._7B.
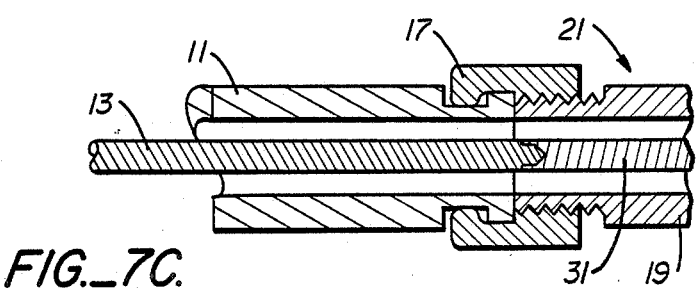
FIG._7C.
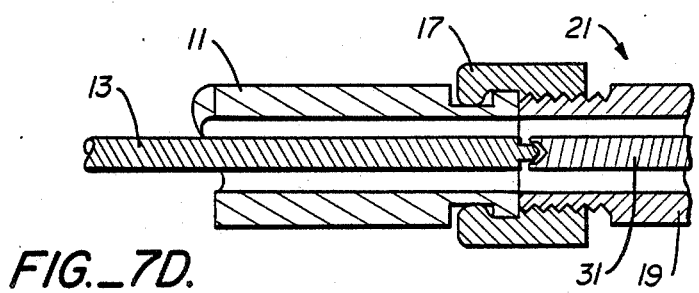
FIG._7D.

ZERO-SETBACK SLIDING LOAD FOR NETWORK ANALYZER CALIBRATION

BACKGROUND OF THE INVENTION

The present invention relates to microwave devices and, more particularly, to a sliding load for calibrating a microwave network analyzer. A major objective of the present invention is a sliding load calibrator providing more accurate calibration of a microwave network analyzer.

Microwave network analyzers are used to determine certain performance parameters for a wide variety of passive microwave devices. A typical network analyzer includes an output port and an input port, each of which includes a coaxial transmission line connector. A "device under test" (DUT) is coupled between the input port and the output port using coaxial cables. The network analyzer transmits broadband signals through the DUT to determine its power transmission and reflection characteristics, commonly referred to as "S" parameters.

Inevitably, the network analyzer itself causes some of the signal attenuation and reflection that it measures. The contributions of the network analyzer to the parameters it is measuring need to be known so that its contribution can be mathematically compensated to yield an accurate characterization of the DUT.

The network analyzer can be characterized by calibrating it using devices of known signal characteristics in place of a DUT. Three standard devices are the short, the open and the sliding load. Many network analyzers are programmed to calibrate themselves on the basis of measurements obtained when these standard devices are in place. The short and the open are simple devices, not much bigger than the network analyzer connector to which they are attached. Accordingly, there has not been much difficulty manufacturing devices which satisfactorily approximate ideal shorts and opens.

There has been considerable difficulty in approximating an ideal sliding load with a commercially practicable device. Typically, a sliding load is an elongated device defining a coaxial air line with a connector at one end and a microwave attenuator at the other. The connector is used to engage a complementary connector of a network analyzer. The microwave attenuator can be moved toward and away from the connector to control the length of the air line. The effect of this movement is to obtain parameter measurements over a range of phases for each frequency in the broadband transmission of the network analyzer. In theory, by measuring the parameters of interest over at least 180° of phase changes, the error components due to the network analyzer can be mathematically isolated from those due to the sliding load. However, this analysis is impaired to the extent that the sliding load differs from the ideal.

One significant deviation from the ideal sliding load occurs at the connection between the sliding load and the network analyzer. An ideal connection would be electrically indistinguishable from a continuous airline. To achieve this, it would be necessary for the connecting center conductors to butt against each other when the outer conductors are butted against each other. This would require perfect axial alignment of center and outer conductor for each of the mating connectors.

An attempt to manufacture connectors with axially aligned center and outer conductors would result in some connectors with the center conductor projecting slightly beyond the respective outer conductor and in some connectors with the center conductor set back with respect to the outer conductor. In the event that two connectors with projecting center conductors are mated, a defective airline would result significantly impairing microwave transmissions. The defect would result from the distortion in the center conductors as they push against each other under the torque used to thread together connectors until their outer conductors join.

By manufacturing coaxial microwave connectors with a small nominal center conductor setback, the percentage of connectors with projected center conductors can be greatly diminished, and the odds of mating two connectors with projecting center conductors can be made statistically insignificant. The price of this manufacturing conservatism is a gap between the mated center conductors. The center conductors are electrically connected with a pin from the male conductor extending across the gap and received within a hole of the mating female connector. However, since the center conductors are not butted, the pin defines abrupt narrowings of the conductor comprising the two mated center conductors. These dimensional variations in center conductor diameter define a center conductor gap which perturbs a signal traversing the connection.

The disturbance caused by such a connector gap is related to its length in such a way that the contributions of each connector to the disturbance is related to their respective setbacks. When a network analyzer is used to characterize a DUT, the raw measurements reflect the setback of the network analyzer connector as well as of the mating connector. Thus effects of the network analyzer setback must be known to permit the DUT to be effectively evaluated.

Due to their function, calibration devices are often manufactured to greater precision than standard connectors. Simple calibration devices such as shorts and opens are manufactured with their relatively short center conductors aligned with the respective outer conductor reference plane. Sliding loads are considerably longer than shorts and opens, and for that reason alone it is difficult to achieve the same degree of conductor alignment.

Furthermore, to provide for a variable-length airline, the center conductor must extend unsupported for a considerable distance within the outer conductor. The relatively thin and unsupported center conductor can be displaced radially relative to the outer conductor without much force. Whereas, alignment of the shorter and therefore better supported center conductors of opens and shorts is ensured by proper alignment of their outer conductors, proper mating of a sliding load center conductor requires special procedures.

Typically, these special procedures require that the sliding load center conductor be free-floating, i.e., be movable axially relative to the outer conductor. Given this condition, the center conductor can be projected in front of the respective reference. So projected, it can be visually aligned with a mating center conductor of a network analyzer connector. Once the center conductors are engaged, the outer conductors can be threaded together until butted together at the reference plane. As the outer conductors are moved together, the sliding load center conductor retracts relative to the respective outer conductor, but remains butted against the connector center conductor. The end result is that the sliding load center conductor extends past the reference plane to eliminate the gap that would otherwise be present due to setback of the network analyzer connector.

Obscured by the projected center conductor, the effects of the network analyzer connector setback fail to be accounted for in the calibration calculations. Therefore, the effects of the network analyzer setback are erroneously attributed to a DUT during device testing. Thus, in providing for proper center conductor alignment during connection, the accuracy of the calibration procedure is compromised.

What is needed is a sliding load which more closely approaches an ideal sliding load. In particular, a sliding load is needed which can be connected to a network analyzer with the contact surface of the center conductor aligned with the reference plane. Yet provision must still be made for visual alignment of center conductors prior to the butting of outer conductors.

SUMMARY OF THE INVENTION

The present invention provides a sliding load with zero setback for more accurate calibration of microwave network analyzers. Zero setback of a center conductor relative to an outer conductor can be achieved by forcing the center conductor against an adjustable stop. The stop can be, for example, a screw the axial position of which can be precisely adjusted by rotation within a threaded hole in the outer conductor.

A latching assembly can elastically deform a spring which, in countering the deformation, forces the center conductor against the stop. The force of the spring is only applied while the latching assembly is in a latched condition. In an alternative unlatched condition, the spring is not deformed and the center conductor is "free floating" along the axis of the outer conductor.

The free-floating state of the center conductor permits it to be projected in front of the reference plane. When the sliding load is connected to a network analyzer, this reference plane is at the outer conductor face which contacts an opposing face of the network analyzer connector. When the center conductor is projected across this plane, engagement with an opposing center conductor of the network analyzer connector can be achieved with visual guidance. Once the center conductors are engaged, the outer conductors are butted against each other.

At this point, the latching assembly can be switched to its latched condition. The latching action elastically deforms the spring while moving the sliding load center conductor back from the network analyzer conductor until it is aligned with the reference plane, at which point its rearward motion is halted by the stop. The spring is arranged so that the force counteracting the elastic deformation urges the center conductor against the stop. In this manner, the center conductor is held in alignment with the reference plane during calibration and until the latching assembly is unlatched.

It is apparent from the foregoing, that an alignment other than zero setback can be achieved. The screw stop can be set to any position relative to the reference plane using a connection gauge while turning the screw. "Spring" herein refers to a range of devices susceptible to elastic deformation.

The latching assembly allows visual alignment of center conductors and subsequent retraction of the sliding load center conductor to the reference plane. This overcomes the problem in prior art devices in which the center conductors remain butted so that the effects of setback in the network analyzer connector are obscured during calibration. Furthermore, the retraction is sufficiently precise that the other extreme, i.e., exaggerrating the effect of the network analyzer setback is also avoided. Accordingly, the effects of network analyzer setback can be precisely determined in the calibration process. The network analyzer so calibrated can then characterize DUTs more accurately. These and other features and advantages of the present invention are apparent in the discussion below with reference to the following drawings.

BRIEF DESCRIPTION OF THE DRAWINGS

FIG. 1 is a perspective view of a sliding load in accordance with the present invention with its handle in an unlatched position and its center conductor in a projected position.

FIG. 2 is a side elevation view of the sliding load of FIG. 1 with its handle in a latched position.

FIG. 3 is a cross-sectional view taken along line 3—3 of FIG. 1 of the sliding load of FIG. 1 approaching a connector of a network analyzer.

FIG. 4 is an enlarged sectional view of the handle end of the sliding load of FIG. 3.

FIG. 5 is an enlarged sectional view of the handle end of the sliding load of FIG. 3 with the handle shown in the lathed position shown in FIG. 2.

FIG. 6 is a diagrammatic sectional view showing inner and outer conductors of the sliding load of FIG. 3 in engagement with the inner and outer conductors of a connector of a network analyzer.

FIGS. 7A–D are diagrammatic sectional views of the connector end of the sliding load of FIG. 3 and a network analyzer connector in successive steps resulting in the desired engagement.

FIG. 8 is an enlarged schematic view of a portion of the sliding load of FIG. 3.

DESCRIPTION OF THE PREFERRED EMBODIMENTS

In accordance with the present invention, a sliding load for calibrating a microwave network analyzer includes an outer conductor 11 and a center conductor 13, the latter shown in a projected position relative to outer conductor 11 in FIG. 1, and obscured in a retracted position of FIG. 2. A grip 15 of plastic or other insulating material is provided so that the sliding load can be held without thermal distortion due to body heat. A threaded nut 17 provides for secure attachment to a complementary threaded outer conductor 19 of FIG. 3, which shows the sliding load in opposition to a network analyzer connector 21 including outer conductor 19 and an inner conductor 31.

Referring to FIG. 8, a slide 23 is attached to a microwave attenuator 25 with a screw 26. Slide 23 is used to adjust the length of an airline air line 27 between outer conductor 11 and inner conductor 13. This length adjustment permits error measurement at different phases as required for distinguishing error components due to the sliding load from those due to the network analyzer. Calibration lines 24, shown in FIGS. 1 and 2, are engraved in outer conductor 11 to provide a reference for positioning slide 23. The tapered character of attenuator 25 is not shown in FIG. 3, but is shown in FIG. 8, which is not intended to be drawn to scale.

Center conductor 13 is cantilevered from microwave attenuator 25 to its tip, which remains unsupported until connection is made to network analyzer connector 21.

Center conductor 13 can deviate from the axis of the sliding load, as shown in FIG. 3, so that during engagement center conductor 13 must be aligned visually with a center conductor 31 of connector 21 before respective outer conductors 11 and 19, shown in FIG. 3, are engaged. Accordingly, means are provided for projecting center conductor 13 forward of outer conductor 11 during connection and for retracting center conductor 13 into alignment with outer conductor 11 to so that any gap between center conductors 13 and 31 is solely due to setback of the latter.

The projection and retraction of center conductor 13 is effected using a latch assembly 33. This latch assembly includes a lever 35, a cam swivel, "cam" 37 herein, a plunger 39 and a spring 41, as shown in FIGS. 4 and 5. When latch assembly 33 is in its unlatched condition, as depicted in FIG. 4, center conductor 13 is free floating relative to outer conductor 11 and can be slid readily into the projected position of FIGS. 1 and 3. This projected position is convenient for visually guided engagement of center conductor 13 with center conductor 31 of network analyzer connector 21.

When latching assembly 33 is in its latched condition, as depicted in FIG. 5, spring 41 is compressed. When so compressed, spring 41 acts to force lever 35 away from cam 37, whicn in turn urges center conductor 13 against a stop 43, which in the illustrated embodiment is the end of a screw 45. Screw 45 can be adjusted so that when center conductor 13 is urged against stop 43, center conductor 13 is properly aligned relative to the reference plane defined by outer conductor 11. This alignment is illustrated in FIG. 6.

FIG. 6 shows a connection between the sliding load and a network analyzer. Front faces 12 and 20, identified in FIG. 7A, of outer conductors 11 and 19, respectively, butt against each other at reference plane R when appropriately engaged as shown in FIG. 6. A pin 47 extending from sliding load center conductor 13 is inserted into a hole 49 of center conductor 31. Network analyzers typically include two connectors such as connector 21, one in a male configuration and the other in a female configuration. The illustrated components include a male sliding load and a female network analyzer connector. An alternative embodiment of the present invention provides a sliding load in a female configuration for engagement with a male connector of a network analyzer.

A contact face 51 of center conductor 31 is set back a distance D from reference plane R. As explained above, this setback provides manufacturing tolerance to ensure that center conductor 31 does not extend beyond reference plane R where it might press against an opposing center conductor and cause damage to a mating connector. However, the setback of contact face 51 is a source of error which needs to be accurately determined so that the network analyzer can be properly calibrated.

The present invention ensures that substantially all effects measured during sliding load calibration that are due to setback, are due to the setback of the network analyzer connector alone. This is done expediently by aligning a contact face 53 of sliding load center conductor 13 with the respective outer conductor 11 so that center conductor 13 neither obscures nor exaggerates the setback of the network analyzer connector 21.

As seen most clearly in FIG. 3, center conductor 13 of the sliding load extends unsupported over at least the length of air line 27. At the connector end of the sliding load, center conductor 13 can easily be displaced from its nominal position on the axis of outer conductor 11, as indicated in FIG. 7A. Thus, it is not generally the case that the center conductor can be connected to an opposing center conductor simply by aligning respective outer conductors.

The provision for a projected position for the sliding load center conductor permits visually guided connection of center conductors 13 and 31. Generally, the engagement of center conductors 13 and 31 involves an initial mating of contact faces 51 and 53 so that the sliding load center conductor 13 extends over reference plane R, as shown in FIG. 7B.

Once center conductors 13 and 31 are engaged, threaded nut 17 is screwed onto outer conductor 19 of network analyzer connector 21. Since center conductors 13 and 31 presumably stay in a fixed relationship to each other and since the relationship of center and outer conductors 31 and 19 of network analyzer connector 21 are fixed, it follows that sliding load center conductor 13 retracts slightly relative to sliding load outer conductor 11 as it progressively engages outer conductor 19 of connector 21. This retraction is apparent from a comparison of FIGS. 7B and 7C. However, a latching step is required to complete the retraction of inner conductor 13 to its ultimate reference position.

FIG. 7C shows the arrangement of components after outer conductors 11 and 19 have been engaged. The most significant features of this arrangement are the extension of sliding load center conductor 13 past reference plane R and the concomitant elimination of the gap between inner conductor contact faces 51 and 53, as labeled in FIG. 6. This arrangement typifies the final connection in many prior art sliding load calibration devices. Network analyzers calibrated with such devices characterize DUTs inaccurately since the effects of the network analyzer setback are attributed to the DUT rather than the network analyzer.

FIG. 7D shows center conductor 13 in its retracted position. Center conductor 13 is forced to this position by the movement of latching assembly 33 from its unlatched condition, shown in FIG. 4, to its latched condition, shown in FIG. 5. With latching assembly 33 in the latched condition, spring 41 urges center conductor 13 against stop 43 so that contact face 53 aligns with reference plane R, assuming screw 45 has been adjusted appropriately. With center conductor face 53 so aligned, the calibration process accurately characterizes the effects of the network analyzer on its signals, including the effects of the setback of its connector. Thus, this more accurate sliding load calibration device provides for a more accurate network analyzer.

Referring again to FIGS. 4 and 5, the alignment of center conductor 13 relative to reference plane R when latching assembly 33 is latched is dependent upon the position of screw 45. Due to inevitable variations in the lengths of center conductors and of outer conductors, it is preferable to allow the position of stop 43 to be adjusted. In the illustrated embodiment, the axial position of stop 43 is adjusted so that center conductor 13 is aligned to within 50 millionths of an inch of reference plane R simply by turning screw 45 with the aid of a suitable connector gauge.

The action of latching assembly 33 is due to the eccentric relation of the curves traced by lever 35 and cam 37 when they are rotated. Cam 37 is pivotally attached to outer conductor 11 and lever 35 is pivotally attached to a carriage portion 55 of center conductor 13. Cam 37 is also pivotally attached by a dowel pin 38 to plunger 39 which slides in a blind hole 36 in lever 35. Spring 41 is seated in blind hole 36 behind plunger 39. As lever 35 and cam 37 are rotated, plunger 39 moves within the blind hole to compensate for the effects of the eccentric relationship between lever and cam.

As lever 35 is rotated to the unlatched position of FIGS. 1, 3 and 4, plunger 39 moves away from spring 41. Once displaced from spring 41, plunger 39 is free to move within the blind hole. Center conductor 13 to which lever 35 is mechanically coupled, is thus free-floating relative to outer conductor 11 which is mechanically coupled to plunger 39.

Lever 35 attaches to center conductor carriage portion 55 using a dowel pin 57, FIG. 1, which extends through a slot 59, FIG. 1, in outer conductor 11. This is the same slot through which slide 23 is coupled to microwave attenuator 25 of FIG. 2. Dowel pin 57 can move along slot 59 in the direction of the conductor axes, as a comparison of FIGS. 4 and 5 indicates. With latching assembly 33 in its unlatched condition, center conductor 13 can be freely projected forward by sliding this dowel pin 57 forward in slot 59. This forward position is that shown in FIGS. 1, 3 and 4 and is used while engaging center conductors 13 and 31.

While lever 35 is rotated toward its latched orientation of FIG. 5, plunger 39 is forced toward spring 41, which at some point begins to compress. Maximum compression occurs when lever 35 is aligned with the conductor axes. This position, which is not illustrated, is meta-stable. Therefore lever 35 is rotated past this axial position until constrained to the orientation shown in FIG. 5. With latching assembly 33 thus in its latched condition, spring 41 is compressed. Spring 41 forces lever 35, and thus center conductor 13, rearward. This rearward motion is constrained by stop 43 at which point the desired alignment, shown in FIG. 6, of contact face 53 with reference plane R is achieved. Built into outer conductor 11 are cam stops 61 and 63 to limit cam motion, and thus lever orientation, in either rotational direction.

A wide variety of latching assemblies can be incorporated by the present invention. For example, the spring can be integral with the cam swivel. In other words, in the latched position, the cam is compressed so as to force the lever, and thus the center conductor, rearward. Likewise, a spring can be disposed within the outer conductor and behind the center conductor carriage. A screw can be used to tension or relax the spring as desired. Tensioning of the spring can involve stretching rather than compressing the spring which then pulls the center rod against a stop. The spring can be a coiled metal wire, a band of elastic material, or other device which can apply a force in response to elastic deformation.

The present invention provides for a wide variety of coaxial connector types. In addition, applications other than network analyzer calibration devices are provided for to the extent such devices require successive connection of center and outer elements and precision alignments with respect to reference planes. More generically, the invention applies to a variety of devices in which a hollow or solid rod requires both a free-floating condition and a predetermined fixed position relative to an incorporating tube. These and other variations on and modifications to the described embodiments are provided for by the present invention, the scope of which is limited only by the following claims.

What is claimed is:

1. An apparatus for connecting to a mating electrical connector, said apparatus comprising:
   a housing for mechanically connecting to said mating electrical connector, said housing defining a first connection plane;
   a center conductor disposed generally within said housing for mechanically and electrically connecting to said mating electrical connector, said center conductor having a tip portion defining a second connection plane; and
   means for extending and retracting said tip portion, said means providing for the extension of said tip portion out of said housing to allow mechanical coupling of said center conductor with said mating electrical connector, said means providing for the retraction of said tip portion into said housing to allow aligning of said second connection plane with said first connection plane while said mating electrical connector is not engaged so that upon connection with said mating electrical connector said second connection plane can be spaced within a predetermined tolerance of said mating electrical connector so as to minimize the separation between said second connection plane and said mating electrical conductor while assuring that minimal axial pressure is applied to said center conductor.

2. The apparatus of claim 1 wherein said means for extending and retracting includes stop means which when in mechanical connection with said center conductor effects alignment of said second connection plane with said first connection plane, said stop means not constraining said extension of said tip portion.

3. The apparatus of claim 2 wherein said means for extending and retracting further includes tension means for holding said center conductor against said stop means when said center conductor is retracted.

4. The apparatus of claim 3 wherein said stop means is adjustable to allow adjustment of said second connection plane.

5. An apparatus comprising:
   a tube;
   a rod extending axially of said tube, said rod cooperating with said tube to define a microwave transmission line;
   adjustable stop means for defining a relative axial position of said rod with respect to said tube, said stop means being mechanically coupled to said tube and rigidly disposed relative to said tube, said stop means including adjustment means for adjusting its axial position relative to said tube so as to determine the relative axial position of said rod when said rod is forced against said stop means;
   spring means for forcing said rod against said stop means, said spring means being mechanically coupled to said tube and said rod, said spring means having a deformed condition in which it forces said rod against said stop means, said spring means having an alternative relaxed condition in which it negligibly constrains axial movement of said rod relative to said tube; and
   latch means for selectively deforming and relaxing said spring means, said latch mean having a latched condition in which said spring means is deformed so that said rod means is forced against said stop means, said latch means having an unlatched condition in which said spring is relaxed so that it negligibly constrains the relative movement of said rod and said tube.

6. The apparatus of claim 5 wherein said rod and said tube define an axially extending cavity which extends radially from said rod to said tube.

7. The apparatus of claim 5 wherein said rod has a rear end toward said stop means and a front end away from said stop means, said rod being cantilevered within said tube so that said rear end has a fixed radial position with respect to said tube and said front end is radially displaceable relative to said tube.

8. The apparatus of claim 5 further comprising means for moving said rod axially relative to said tube when said latch means is in its unlatched condition.

9. The apparatus of claim 5 wherein said latch means is mechanically coupled to said rod means so that said latch means can be moved while in said unlatched condition so as to cause said rod to be axially moved relative to said tube.

10. A sliding load for a calibrating microwave network analyzer comprising:
 an outer conductor having an axis, said outer conductor defining a reference plane at an axial connection end thereof;
 a center conductor generally aligned with said axis, said center conductor and said outer conductor defining an axially extending air line situated radially between said center conductor and said outer conductor;
 a slidable load of material for dissipating microwave energy, said slidable load being disposed within said outer conductor so as to define the termination of said air line;
 slide means for selecting the axial position of said slidable load, said slide means being rigidly coupled to said slidable load and slidably coupled to said outer conductor;
 stop means for defining a predetermined relative axial position between said center conductor and said reference plane, said stop means being rigidly coupled to said outer conductor;
 adjustment means for adjusting said predetermined relative axial position, said adjustment means being mechanically coupled to said stop means; and
 latching means for providing free-floating and fixed conditions of said center conductor, said latching means having an unlatched condition in which the axial movement of said center conductor is unconstrained so that said center conductor can be projected away from said stop means, said latching means having a latched condition in which the axial movement of said center conductor is constrained, said latching means having a spring means for forcing said center conductor against said stop means when said latching means is in said latched condition.

11. The sliding load of claim 10 wherein said spring means is a spring and said latching means further comprises:
 a lever pivotally attached to said center conductor, said lever having a blind hole in which said spring is seated;
 a plunger extending at least partially into said blind hole and being slidable with respect to it; and
 a cam pivotally attached to said outer conductor and to said plunger;
 whereby,
  when said latching means is in said unlatched condition, said plunger is not constrained by said spring from movement within said blind hole so that said lever and said center conductor can be moved axially of said outer conductor, and
  when said latching means is in said latched condition, said plunger compresses said spring which in turn applies a force to said plunger which forces said lever and said cam apart, thus forcing said center conductor against said stop means.

* * * * *

UNITED STATES PATENT AND TRADEMARK OFFICE
CERTIFICATE OF CORRECTION

PATENT NO. : 4,797,642
DATED : January 10, 1989
INVENTOR(S) : Robert E. Rennard

It is certified that error appears in the above-identified patent and that said Letters Patent is hereby corrected as shown below:

Column 2, Line 36, "effectively" should read -- accurately --;

Column 4, Line 3, "exaggerrating" should read -- exaggerating --;

Column 4, Line 4, "setback is" should read -- setback, is --;

Column 4, Line 27, "lathed" should read -- latched --;

Column 5, Line 26, "whicn" should read -- which --.

Signed and Sealed this

Twelfth Day of December, 1989

*Attest:*

JEFFREY M. SAMUELS

*Attesting Officer*     *Acting Commissioner of Patents and Trademarks*